US006750523B2

(12) United States Patent
Blanchard

(10) Patent No.: US 6,750,523 B2
(45) Date of Patent: Jun. 15, 2004

(54) PHOTODIODE STACKS FOR PHOTOVOLTAIC RELAYS AND THE METHOD OF MANUFACTURING THE SAME

(75) Inventor: Richard A. Blanchard, Los Altos, CA (US)

(73) Assignee: Naos Convergent Technology, Inc., San Jose, CA (US)

( * ) Notice: Subject to any disclaimer, the term of this patent is extended or adjusted under 35 U.S.C. 154(b) by 0 days.

(21) Appl. No.: 10/376,009

(22) Filed: Feb. 28, 2003

(65) Prior Publication Data

US 2003/0173581 A1 Sep. 18, 2003

Related U.S. Application Data

(60) Provisional application No. 60/360,707, filed on Mar. 1, 2002.

(51) Int. Cl.[7] .......................... H01L 31/06; H01L 31/00
(52) U.S. Cl. ....................... 257/461; 257/459; 257/463; 257/465
(58) Field of Search ................................. 257/459, 461, 257/463, 465

(56) References Cited

U.S. PATENT DOCUMENTS

| 4,634,883 | A | * | 1/1987 | Nishiura et al. ............ 358/482 |
| 5,847,614 | A | | 12/1998 | Gilbert et al. |
| 5,907,484 | A | | 5/1999 | Kowshick et al. |
| 6,191,642 | B1 | | 2/2001 | Nguyen |
| 2002/0070416 | A1 | * | 6/2002 | Morse et al. ................ 257/443 |

* cited by examiner

Primary Examiner—Ngân V. Ngô
(74) Attorney, Agent, or Firm—Richard K. Robinson

(57) ABSTRACT

A series of connections of photodiodes has a plurality of alternating N-type conductivity surface areas with P-type conductivity surface areas with each member of the P-type conductivity surface areas being separated by a member of N-type conductivity surface areas. Metal conductors connect the P-type conductivity areas to the N-type conductivity areas at an N+ implanted area within the N-type conductivity surface area to form the series connection of photodiodes.

14 Claims, 17 Drawing Sheets

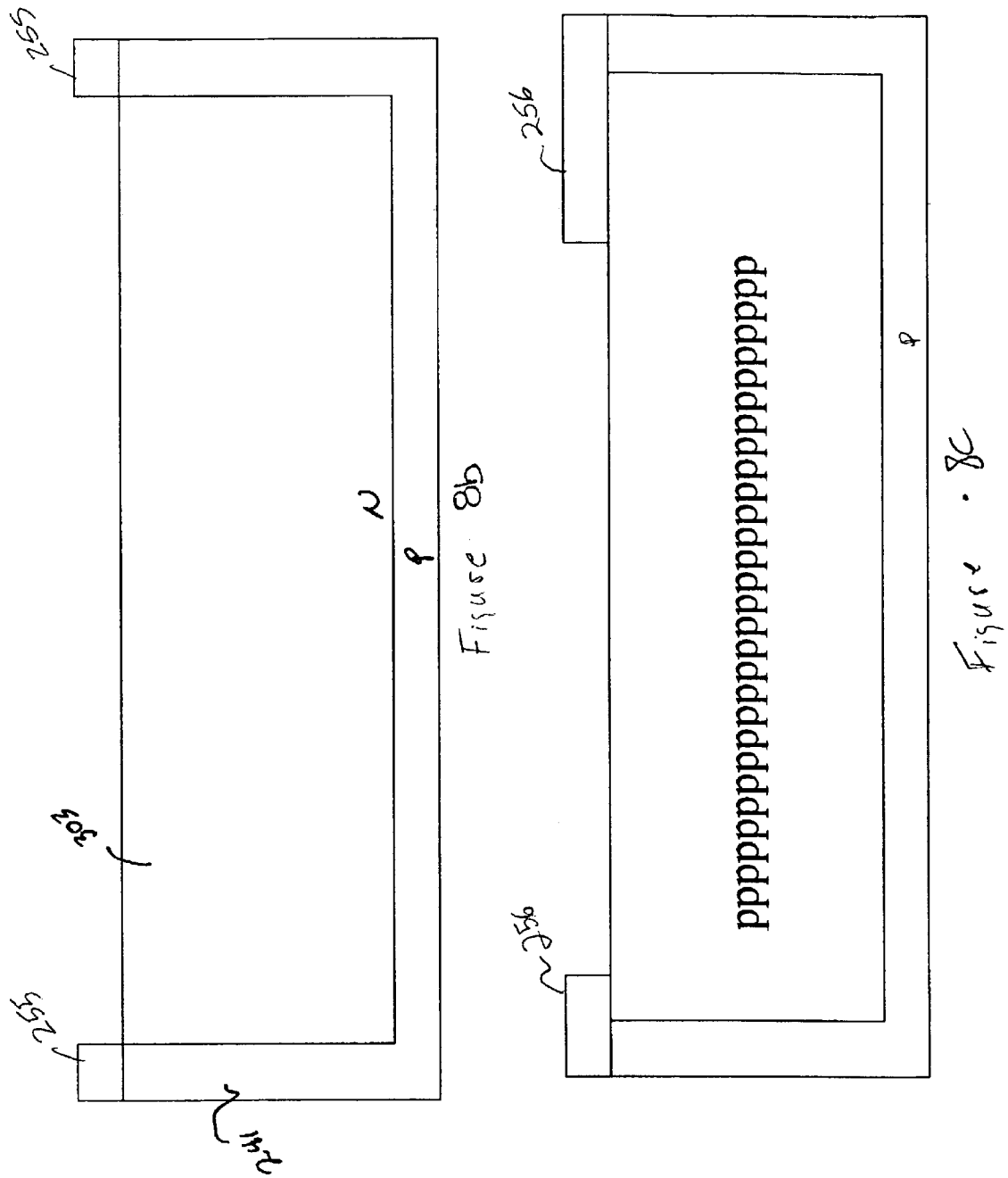

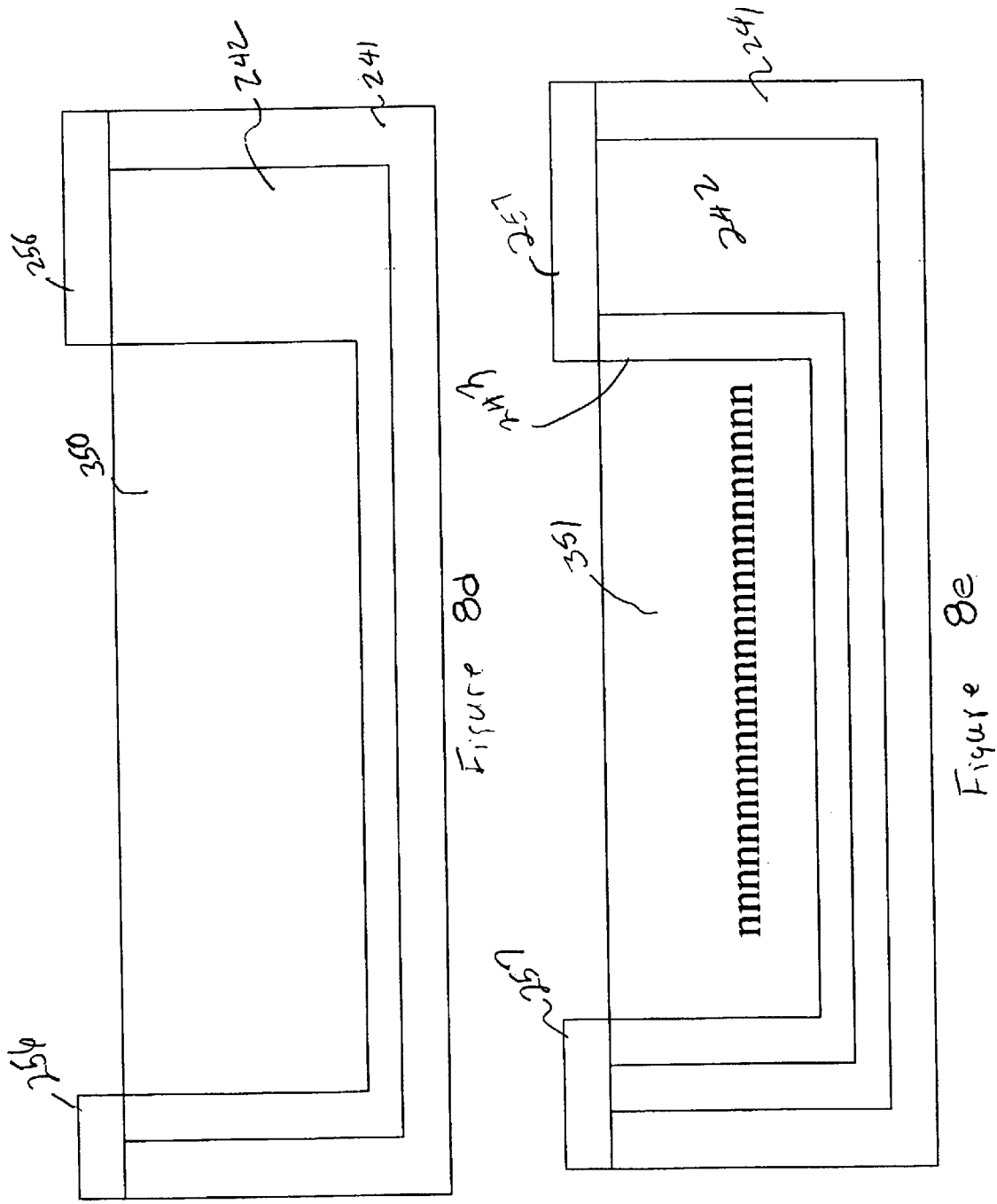

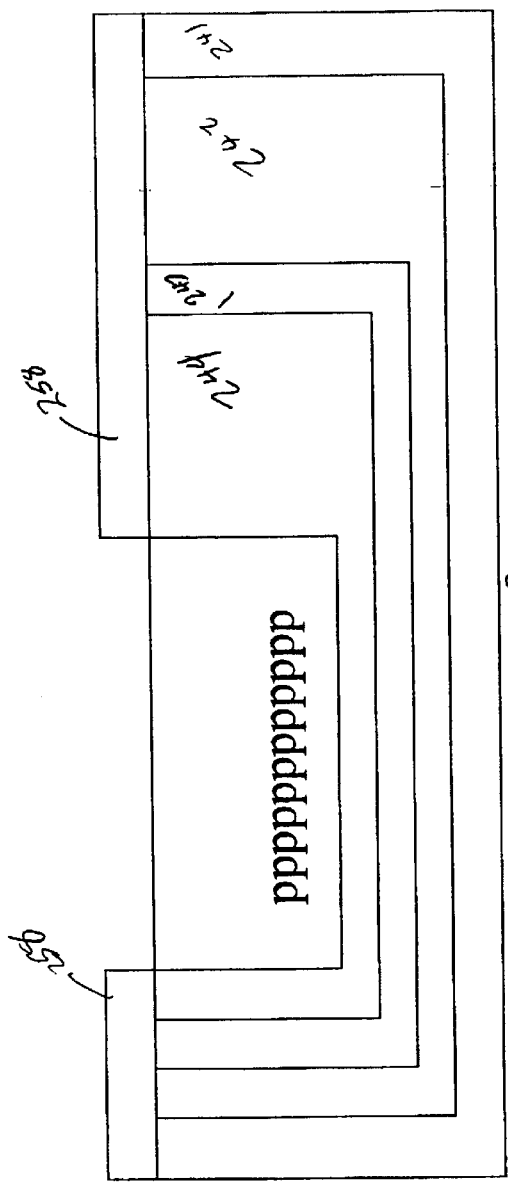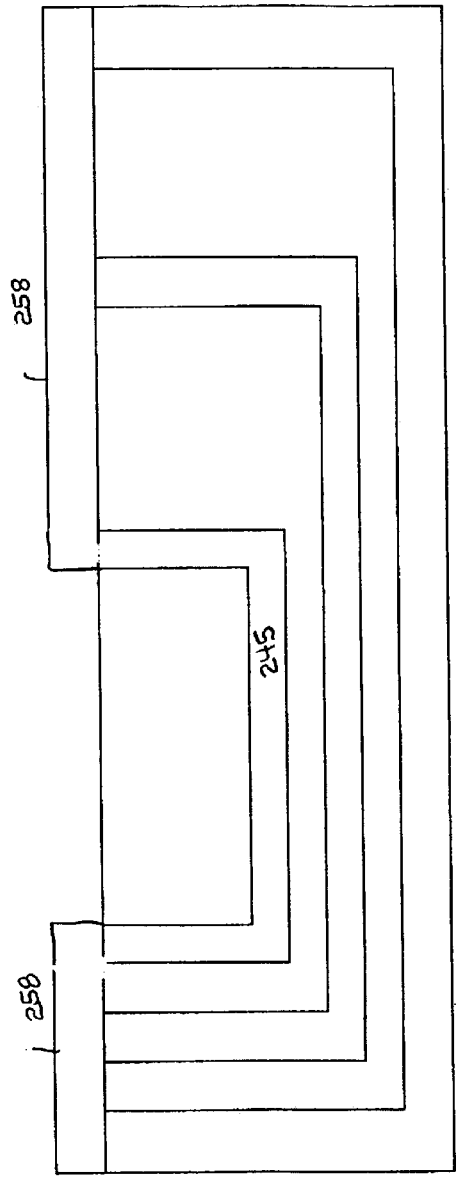

PHOTODIODE STACKS FOR PHOTOVOLTAIC RELAYS AND THE METHOD OF MANUFACTURING THE SAME

RELATED APPLICATIONS

This application is a non-provisional application of provisional application serial No. 60/360,707 filed on Mar. 1, 2002.

BACKGROUND OF THE INVENTION

This invention relates to photodiodes stacks and the method of manufacturing the same.

Photodiodes are devices that convert light to electricity. When light shines on a photodiode, it produces current at a voltage, which may be used to supply the power to operate a device or a circuit. The shape of the current versus voltage curve for a specific photodiode is largely determined by the material(s) used in its fabrication. One of the many uses of photodiodes is digital imaging devices.

Digital imaging devices are becoming increasingly popular in a variety of applications such as digital cameras, fingerprint recognition, communications systems, digital scanners and copiers and isolation applications. In recent years, many low cost photodiode CMOS image sensor applications have the active photodiode CMOS image sensor replaced the charge coupled device (CCD). This is because the active photodiode CMOS sensor provides characteristics such as high quantum efficiency, low read noise, high dynamic range and random access. In addition, it is highly compatible with CMOS device fabrication process. Therefore, other control circuits, analog-to-digital circuits (A/D converter), and digital signal processing circuits can be integrated with the CMOS image sensor on the same chip.

The challenge of cost reduction implies a drive for minimizing the number of process steps, especially a minimum number of photo-mask steps, and the application of standardized process conditions wherever possible. These constraints should be kept in mind when additional process steps or new process conditions are proposed to reduce Photodiodes dark current and improve light sensitivity and responsivity without sacrificing any desirable device characteristics. An urgent need has, therefore, arisen for a coherent, low-cost method of reducing dark current in photodiodes fabricated by CMOS technology, and, simultaneously, improve the degree of component integration at the pixel level. The device structure should further provide excellent light responsivity and sensitivity in the red as well as the blue spectrum, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

Additionally increasing the voltage output of a photodiode has been a goal of the prior art. For example U.S. Pat. No. 6,504,142 discloses: "Light sensors having a wide dynamic range are used in a variety of applications. A wide dynamic range light sensor includes an exposed Photodiodes light transducer accumulating charge in proportion to light incident over an integration period. Sensor logic determines a light integration period prior to the beginning of integration and the charge is reset. Charge accumulated by the exposed light transducer over the light integration period is measured and a pulse having a width based on the accumulated charge is determined."

The operations of photodiodes can be understood from U.S. Pat. No. 6,501,165 which discloses: "An image sensor comprising a first conductive layer, which is part of a circuitry of an integrated circuit device. A light sensing device is disposed vertically atop the first conductive layer and the circuitry. The first conductive layer is coupled to one electrical side of the light sensing device. A second conductive layer is disposed above the light sensing device and coupled to an opposite electrical side of the light sensing device. The second conductive layer is coupled to provide a circuit coupling for the circuitry when the light sensing device conducts."

A prior art method of manufacturing is disclosed in U.S. Pat. No. 6,351,002 which states: "This invention provides a photodiodes comprising a first conductive type doped substrate, a second conductive type heavily doped region, a dummy isolation layer, a first conductive type heavily doped region and an isolation layer. The second conductive type heavily doped region is located in the first conductive doped substrate of which the doping concentration is lower than that of the second conductive type heavily doped region. The dummy isolation layer is formed at the peripheral of the second conductive type heavily doped region. The first conductive type heavily doped region is located at the peripheral of the dummy isolation layer in the first conductive doped substrate. Dopant concentration in the first conductive type heavily doped region is higher than that of the first conductive type doped substrate. The isolation layer is located at the peripheral of the first conductive heavily doped region of which the width is significantly larger than that of the dummy isolation layer."

All three of the above identified patents are incorporated herein by reference.

SUMMARY OF INVENTION

If a voltage is required that is greater than the voltage available from a single photodiode, a number of them may be connected in a series in a "stack" to produce a greater voltage.

A number of materials, including semiconductors such as silicon, or even organic materials may be used to manufacture photodiodes. Silicon is often used because circuits containing other devices such as transistors, resistors, and capacitors may be fabricated simultaneously with photodiodes in the same silicon substrate.

The fabrication of a "stack" of silicon photodiodes requires either:

A. Series Connected Photodiodes:
  Each photodiode is fabricated such that it can be connected in series with one or more other photodiodes, but each photodiode is not electrically isolated from every other photodiode by a layer of dielectric.
B. Isolated Photodiodes:
  Each photodiode is electrically isolated from every other photodiode by a layer of dielectric, with an interconnection present between photodiodes to connect them in series.

Described herein are techniques that may be used to realize a photodiode stack using both of the two approaches listed above for supplying the input power to drive photovoltaic relays and image sensors.
A. Series Connected Photodiodes
  1. The first of these techniques uses two layers of silicon that have been doped to produce regions having alternating conductivity types. These regions of alternating conductivity type may be stripes, concentric circles, or any other geometry. The top view of this photodiode stack is shown in FIG. 1a, and the cross section of the configuration is shown in FIG. 1b. This cross section is taken through a set of parallel strips that are bounded below, and on all sides by electrically insulating dielectric layers. As shown in FIG. 1b, every other pn-junction has a short circuit present, resulting in the equivalent electronic circuit shown in FIG. 2. The regions of the photodiode string that are shown in the cross section of FIG. 1a may be obtained by the process sequence shown in FIG. 3. (The steps required to provide dielectric isolation around the entire diode string are not shown, but may be realized using techniques that are well known in the art.)

2. The second of these techniques uses nested regions of silicon having alternating conductivity type to produce the diode stack. A top view of one version of this structure is shown in FIG. 4a and a cross section is shown in FIG. 5b. The equivalent circuit is shown in FIG. 5c. This structure is fabricated by introducing dopant into a layer of silicon that is (or will be) dielectrically isolated. Another version of this structure is shown in FIG. 6. In this version, the alternate p-type and n-type regions are formed in a silicon wafer without the use of a dielectric layer beneath the structure, while FIG. 7 shows the cross section and FIG. 9 the equivalent circuit. The use of a wafer without the presence of an underlying dielectric layer reduces the cost of the starting wafer for this version.

The top view of a third version of this technique is shown in FIG. 9 while a cross section is shown in FIG. 10. This third version uses an epitaxial layer on a substrate of the opposite conductivity type. As shown in FIG. 11, the equivalent circuit of this version consists of three photodiodes in series. The fabrication of the structures shown in the figures require that each "nested" region have a higher doping region than the region it is "nested" within. This requirement sets a practical limit on the number of photodiodes connected in a single stack using this structure to approximately 3–4 photodiodes. However, these stacks may be connected in parallel to provide greater current while optimizing layout efficiency.

Both of these techniques provide photodiode stacks with the characteristics listed below:

1. Bonded wafers or another type of dielectric isolation are use to provide bottom isolation and sidewall isolation.

2. The photodiodes in the stack are physically isolated from each other by pn-junctions, some of which are electrically shorted to active regions of the photodiode.

These features differentiate the present photodiode fabrication techniques from the prior art. In addition, the photodiode stacks formed using only pn-junction isolation may be used with "voltage multiplying" circuitry to increase the available voltage, and be able to directly drive the gate of a solid state witch such as MOSFET. Voltage multiplying circuits are well known in the art. See U.S. Pat. No. 5,907,484 by Kowshick et al., U.S. Pat. No. 5,847,614 by Gilbert et al., and U.S. Pat. No. 6,191,642 by Nguyen, which are incorporated herein by reference. They take a given input voltage, and produce an output voltage that is higher than the input voltage by some multiple. Voltage doubling and voltage tripling circuits are commonly used to boost a relatively low voltage to a voltage that is high enough to perform the intended function. FIG. 12 is a block diagram showing a photodiode stack and a charge pump used to produce an output voltage large enough to drive the gate of a MOSFET. The charge pump must be fabricated in a region of the semiconductor that does not allow unwanted electronic communication between the photodiode stack and the charge pump circuitry. This requirement can be met in CMOS, BICMOS, or bipolar technology.

B. Isolated Photodiodes

1. Isolated photodiodes may be fabricated on an insulating layer such as silicon dioxide using amorphous silicon. These separate photodiodes are then connected in series to supply a voltage high enough to drive the relay.

2. Isolated photodiodes may also be fabricated on an insulating layer such as silicon dioxide using organic materials. Organic photodiodes may also be connected in series to provide a voltage high enough to drive the relay.

Both of these types of photodiodes can be formed on a variety of dielectrics, including the passivating layer of an integrated circuit or "I.C." By placing either of these types of photodiodes above the active circuitry, the interconnect, and the passivating layer as shown in FIG. 7, there is essentially no additional surface area required for the photodiode array. Also, both amorphous silicon and organic photodiodes may be formed using temperatures below about 450° C., their fabrication on the surface of the IC above the passivating layer is compatible with the previous processing steps that the IC has undergone.

BRIEF DESCRIPTION OF THE FIGURES

FIGS. 3a to 3h illustrate the steps used to manufacture the embodiment of FIG. 1;

FIGS. 8a to 8j illustrate the steps used to manufacture the embodiment of FIG. 6;

DETAILED DESCRIPTION OF THE EMBODIMENTS

Figure 1:
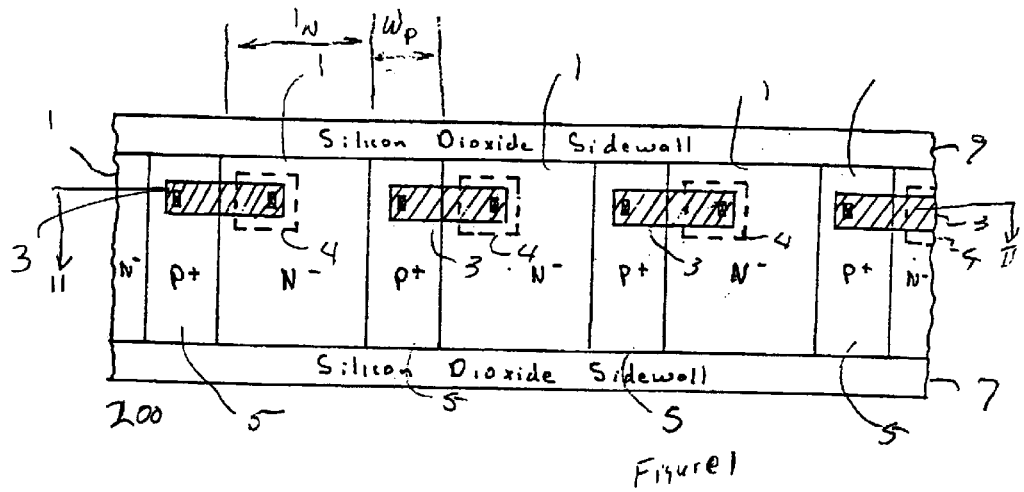
FIGS. 1a and 1b show a photodiode stack fabricated in a single dielectrically isolated region, from the top.
Figure 1B:
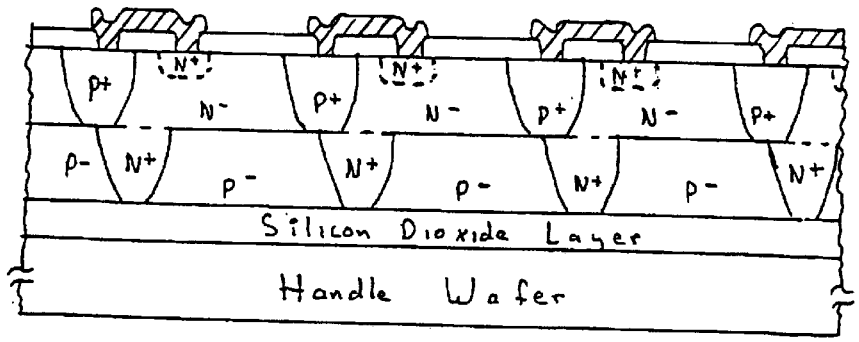

FIG. 1 is a top view of a photodiode stack 200. The diode stack includes alternating regions of N− type conductivity 1 separated by P+ type regions 5. There are dielectric sidewalls of silicon dioxide 7. Contact between each P+ and N− regions is provided by conductors 3 and an N+ region 4 implanted in each N− type region 1. The N+ region 4 insures good ohmic contact with the connecting conductor 3. The width of each region 1 is represented by dimension lines Wn and is substantially larger that the width Wp of the of the P+ regions 5. N type materials are more efficient in converting photons into electrons than P type materials. The surface area of the N− regions 1 are ideally approximately equaled.

Figure 2:
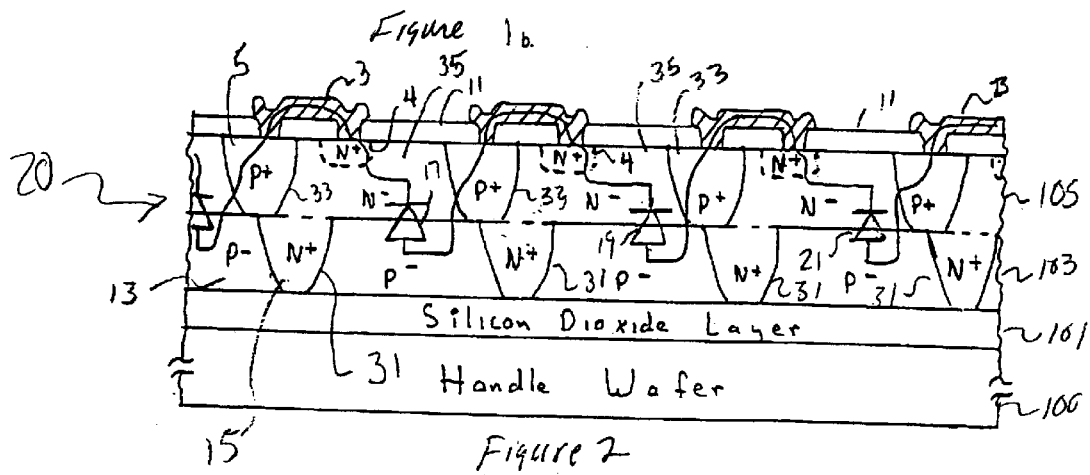
FIG. 2 is a schematic illustration of the embodiment of FIG. 1.

Referring to FIG. 2 there is a sectional view of the photodiode stack 200 of FIG. 1 and includes a schematic representation of the photodiode stack of FIG. 1. The device includes a handle wafer 100 on which there is a dielectric layer of silicon dioxide 101 that provides isolation between the circuitry 20 and the handle wafer 100. The circuitry 20 includes a first semiconductor layer 103 of P− type conductivity material with the layer 103 having regions 15 of N+ type conductivity implanted there into. The circuitry 20 additionally includes a second semiconductor layer 105 of W− type conductivity material 35 with the layer 105 having regions 33 of P+ type conductivity implanted there into. Silicon dioxide layer 11 provides insolation between the top surface of semiconductor layer 105 and the conductors 3.

The interface between the N+ doped regions 15 and the P− region 13 always forms a pn-junction 31. The relative concentrations of dopant in both the N+ doped regions 15 and the P− regions 13 determine the actual characteristics of the resulting pn-junction 31. The breakdown voltage of the junction is usually determined by two variables: The doping concentration on the lightly doped side of the junction 2, the junction depth. In FIG. 2, the P+ regions 33 in the n-type fields 35 will have a fairly high breakdown since the n-type region is relatively lightly doped. The part of the junction having the lowest breakdown voltage is the intersection of a P+ region 33 on the surface and the N+ region 31 in the underlying layer. However, even this junction is likely to have a breakdown voltage in excess of 5 volts, since it is quite difficult to get an N+/P+ junction with a breakdown voltage much lower than this value. In addition, since the P+ and the N-type regions are shorted together by the metal conductor 3 at the surface of the device, there is no voltage across the P+/N+ junctions.

The photodiode stack 200 is manufactured by using the process of FIG. 3 and starts with a handle wafer 100 on which there is an silicon oxide layer 101 for insulation and on which there is a layer 103 of P− type conductivity semiconductor material. A masked and etched layer of silicon oxide 110 is gown on the exposed or top surface of layer 103. An ion implant of N+ type doping is perform using the silicon oxide layer 110 as shown in FIG. 3b at points N.

Figure 3A:
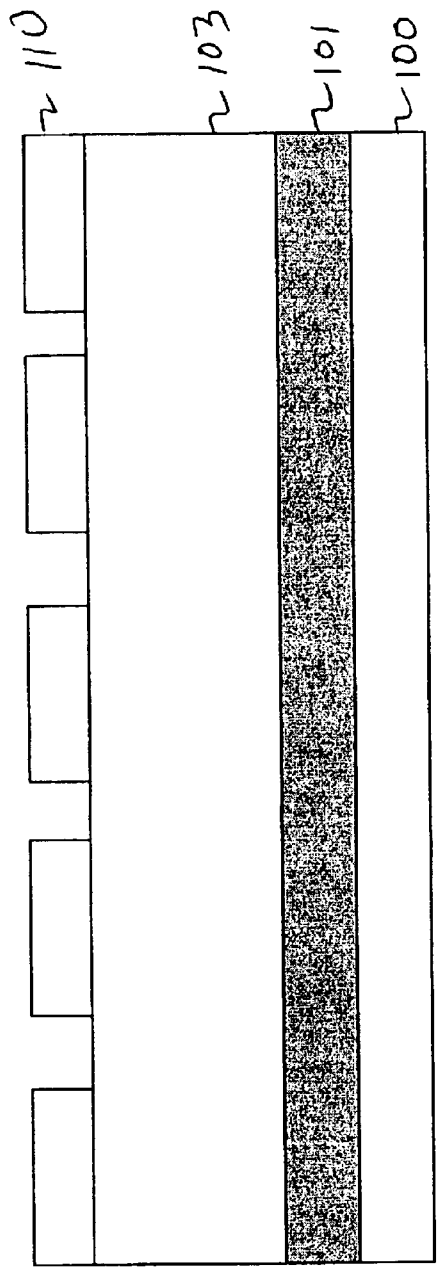
Figure 3B:
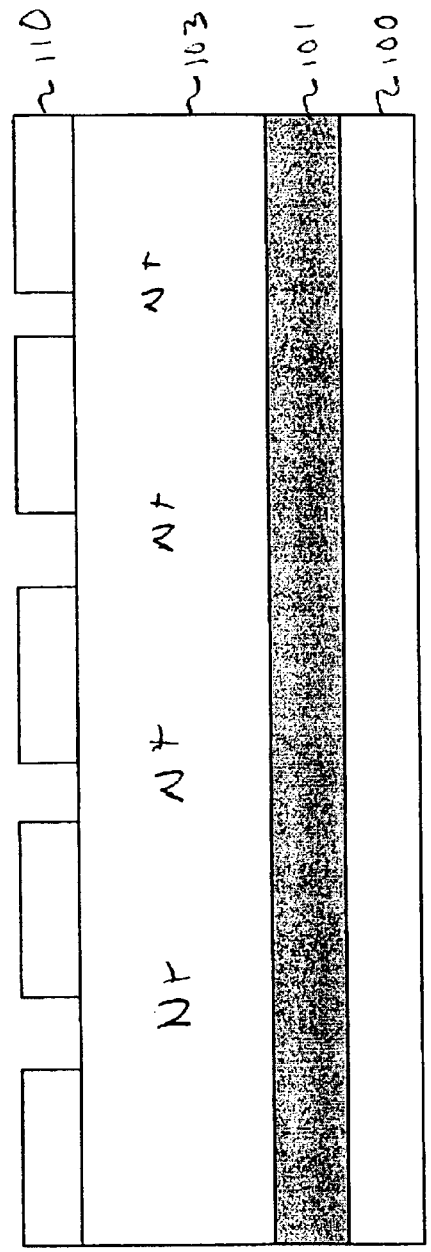
Figure 3D:
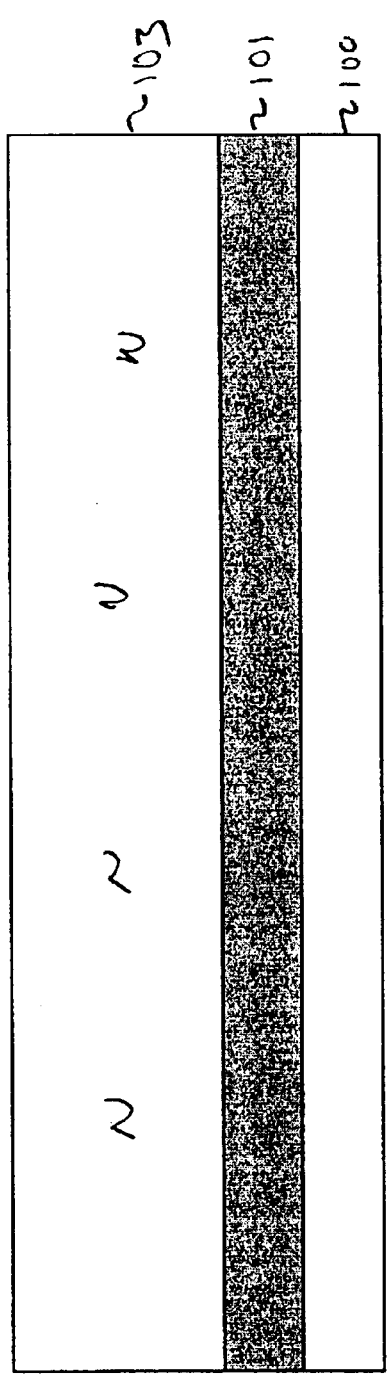
Figure 3E:
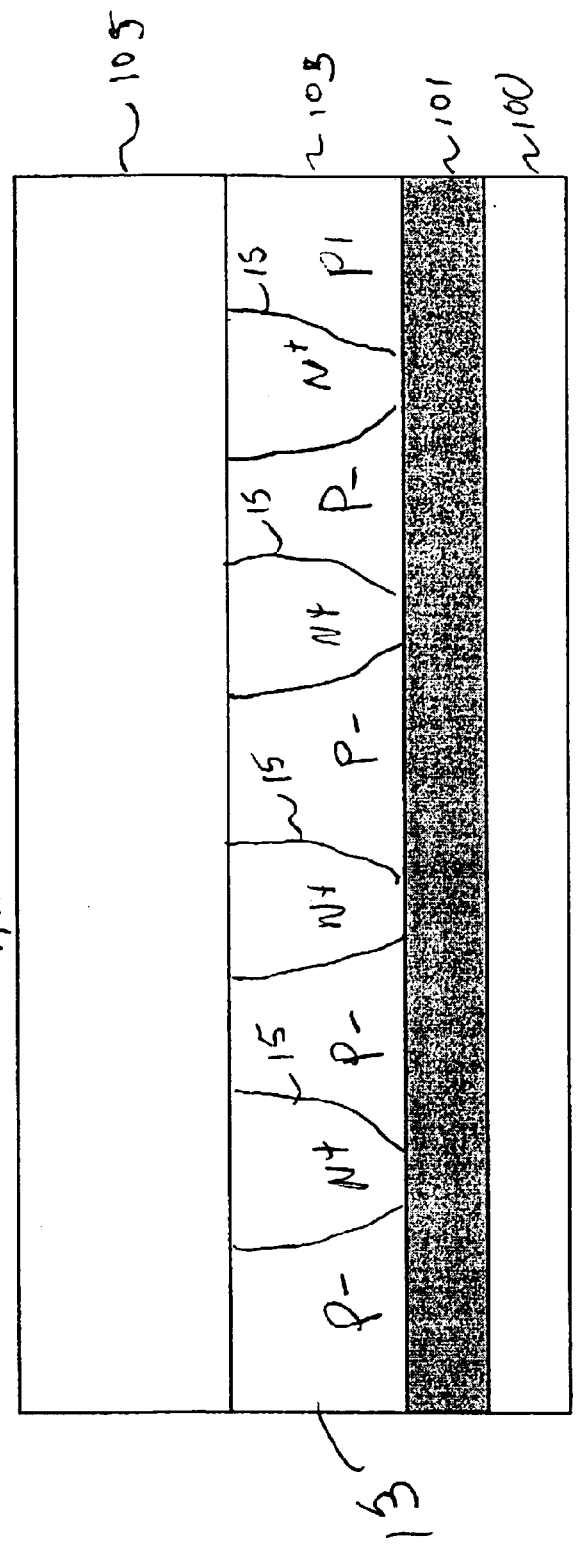
Figure 3D:
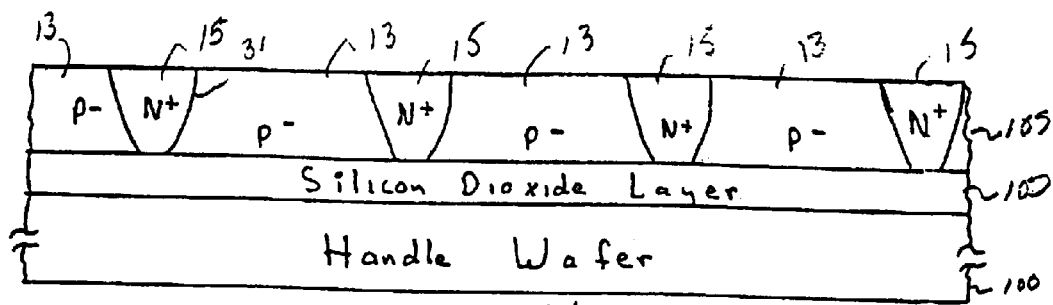

Referring to FIG. 3c the silicon oxide layer 110 is removed and an anneal process may be performed at his point as shown in FIG. 3d to create N+ regions 15 separated by p− region 13 or delayed until later as shown in FIG. 3e.

Figure 3G:
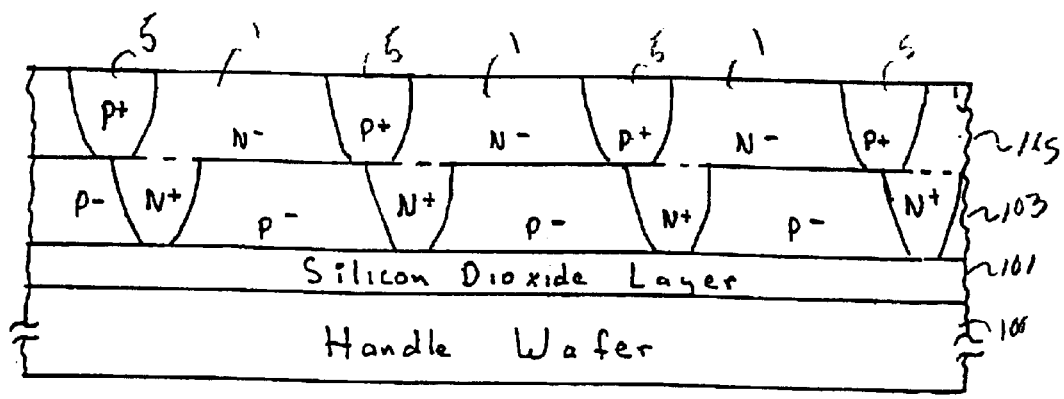

FIG. 3e shows the results of depositing a second semiconductor layer 105 of N− conductivity. After growing a silicon dioxide layer 120 an ion implant of P+ type doping is perform using the silicon oxide layer 120 as a mask as shown in FIG. 3f at points P. After annealing FIG. 3g shows the semiconductor layer 105 having region of P+ type conductivity.

Figure 3H:
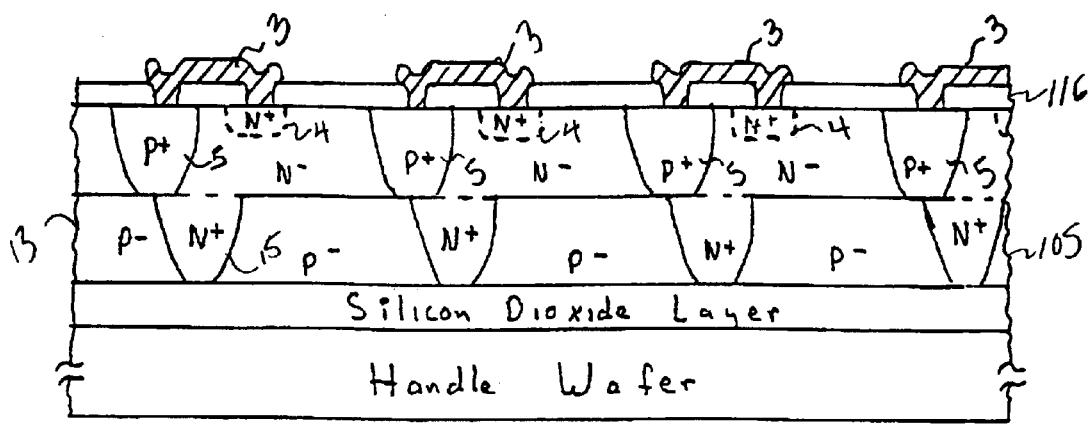
Figure 3F:
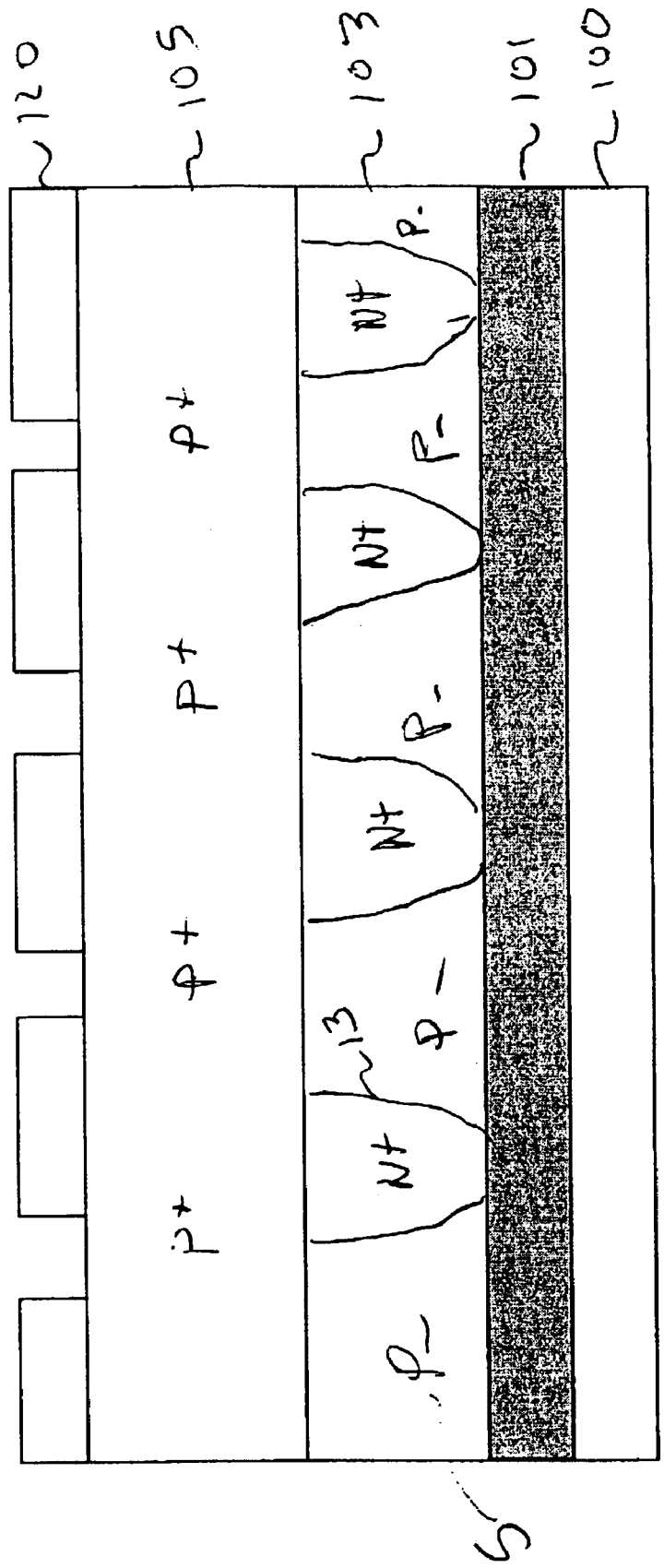

Referring to FIG. 3h, a mask step is performed and an silicon oxide layer 116 is grown. N+ regions 4 are implanted and a metalization step is performed to provide metal connectors 3 that connect the P+ region 5 to the N+ regions 4. It should be noted in FIG. 3h that the P+ regions not only contact the N+ regions 15 of the layer 105, but also is contact with the P− region 13. This of course creates a short circuit of the P+ to N+ regions so that the photodiodes created between the P+ region and the N− region are operative. As previously noted FIG. 2 is a schematic representation of the photodiodes that are provided and it includes each P+ region 5 and the N+ region 4 so that a stack of diodes as represented by diodes 17, 19 and 21 are operative.

Figure 4:
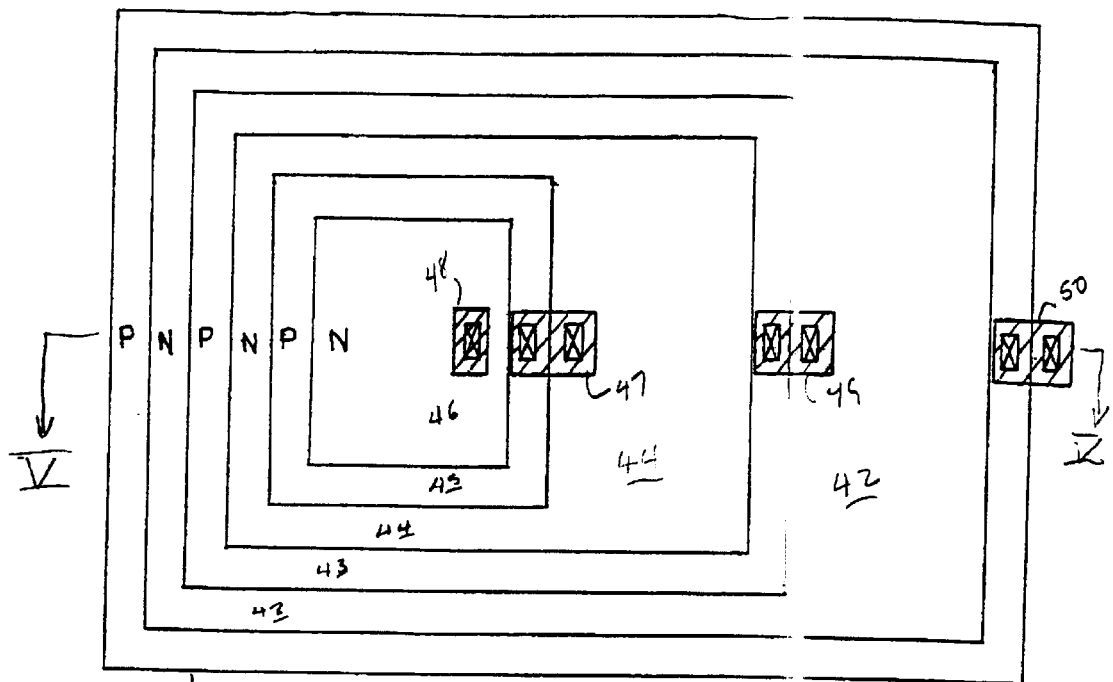
FIG. 4 shows an alternate embodiment of a photodiode stack from a top view.

Referring to FIG. 4, there is shown a top view of an alternate embodiment of a series connection of photodiodes. The N regions 46, 44 and 42 are the photon collection regions and these provide for the primary surface area for the photon collection. Each surface area 46, 44, 42 are approximately equal so that the photons collected should produce the same amount of electricity if all other parameters have been optimized. The width and length are modified so that the collection areas will be approximately identical.

Figure 5B:
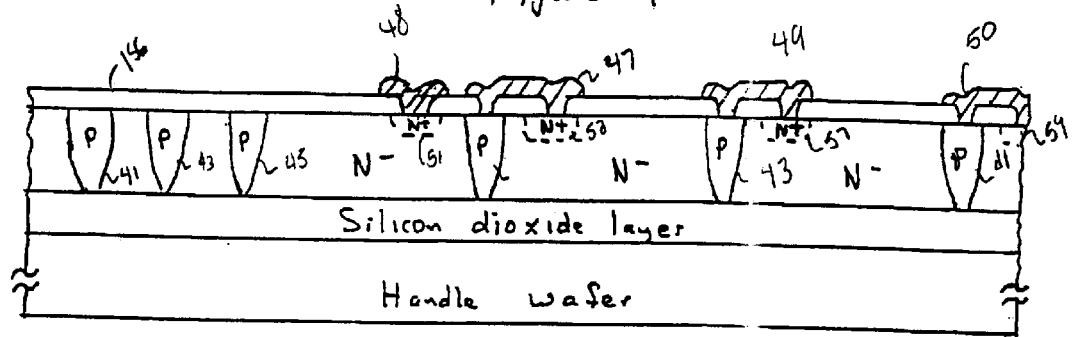
FIGS. 5a to 5c illustrate the steps used to manufacture the embodiment of FIG. 4 with FIG. 5a showing a cross sectional view of the embodiment of FIG. 4 and FIG. 5g showing a schematic illustration of the embodiment of FIG. 4.
Figure 5C:
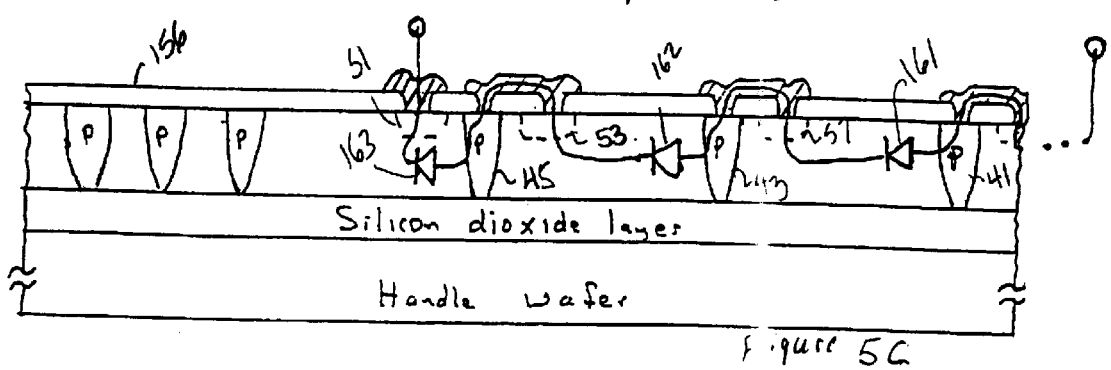
Figure 5A:
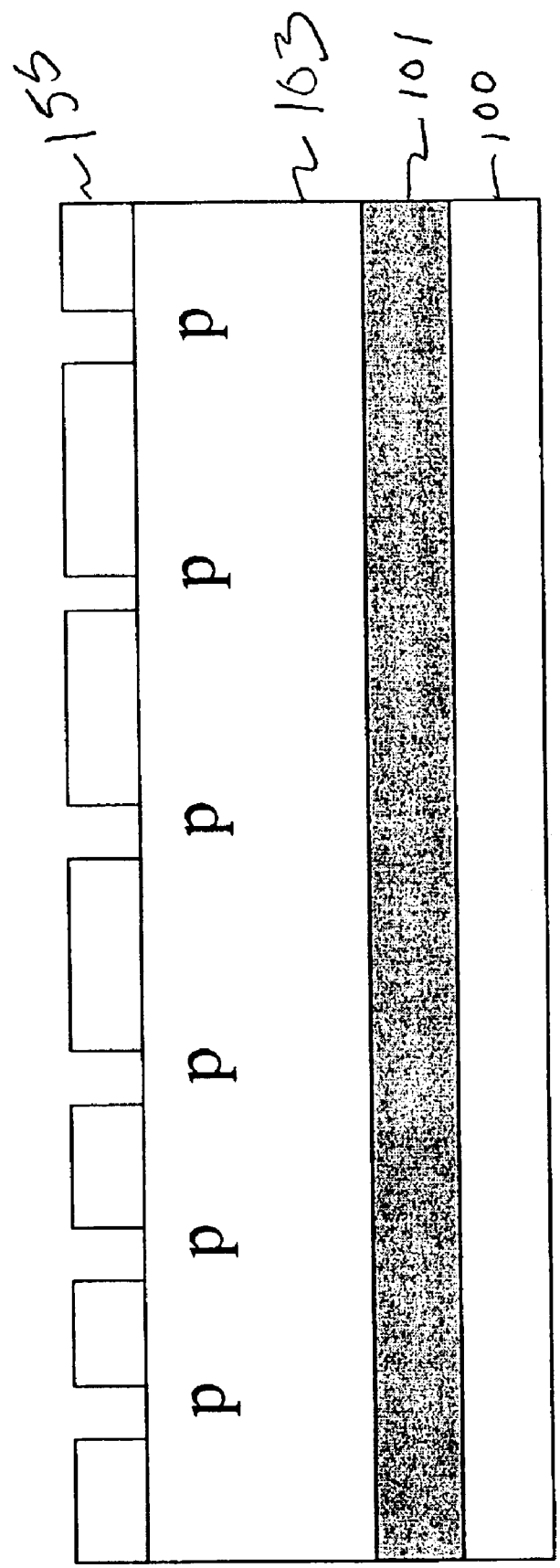

Referring to FIG. 5a, the process for manufacturing the device of FIG. 4 includes starting with a handle wafer 100 on which an oxide layer 101 is grown and following which there is deposited a layer 103 of N− type doping. An oxide mask 155 is grown on top of the oxide layer 103 and an implant of p dopant as shown by the "p"s of FIG. 5a is performed. After an anneal process, a mask step is performed and a second oxide layer 156 is grown and an implant of N+ connecting regions 51, 53, 57 and 59. A metalization step is then performed providing for terminals 48 and 50 and connectors 47 for connecting the P region 45 to the N+ region 53 and similarly for connecting the P region 43 to the N+ region 57 as shown in FIG. 5b.

FIG. 5c provides a schematic representation of the series photodiodes and includes a first photodiode 161 that is made by a connection between the P region 41 with the N+ region 57. A second diode 162 is created by the connection between the P region 43 and the N+ region 53. Finally a third diode 163 is provided between the P region 45 and the N+ region 51.

Figure 6:
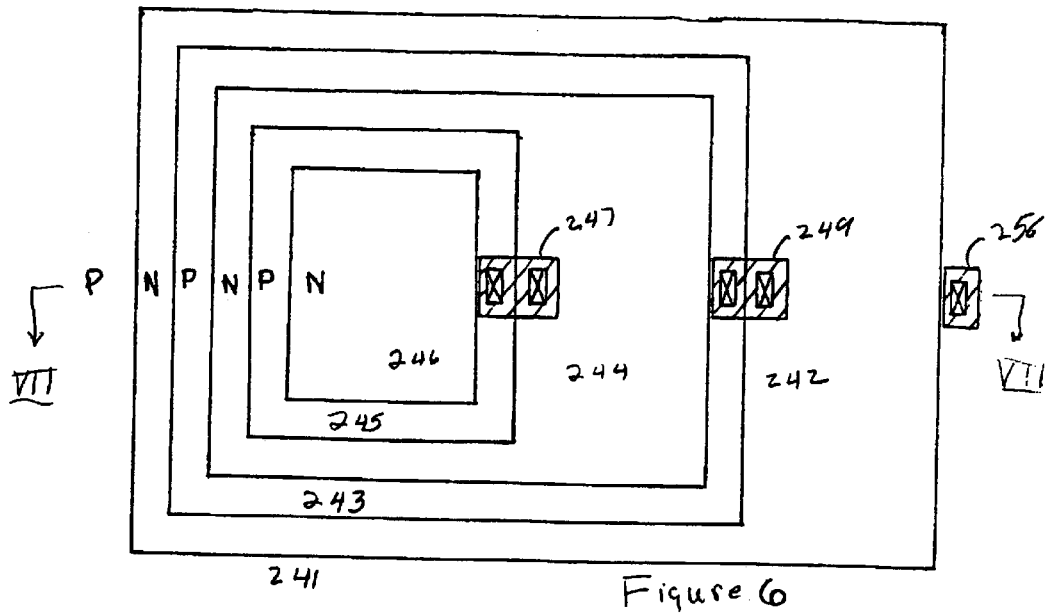
FIG. 6 shows an alternate embodiment of a photodiode stack from a top view.

Referring to FIG. 6 there is shown a top view of the device very similar to that of FIG. 4 in which there is nested alternating P regions and N regions with the P regions being the regions 241, 243 and 245 and the N regions being regions 242, 244 and 246. The exposed surface areas of the N regions are equal for ideal performance. The P region 245 is connected to the N region 244 via conductors 247, and P region 243 is connected to the N region 242 via conductors 249, with a terminal 256 being connected to the P region 241. There is an N+ region 257 that is used to ensure good contact with the conductor 249 to the − region 242 an similarly an N+ region 253 is used for connecting the conductor 247 to the − region 244. Finally, for terminal 248 there is an N+ region 251 that ensures good contact for the respective terminals and conductors.

Figure 8A:
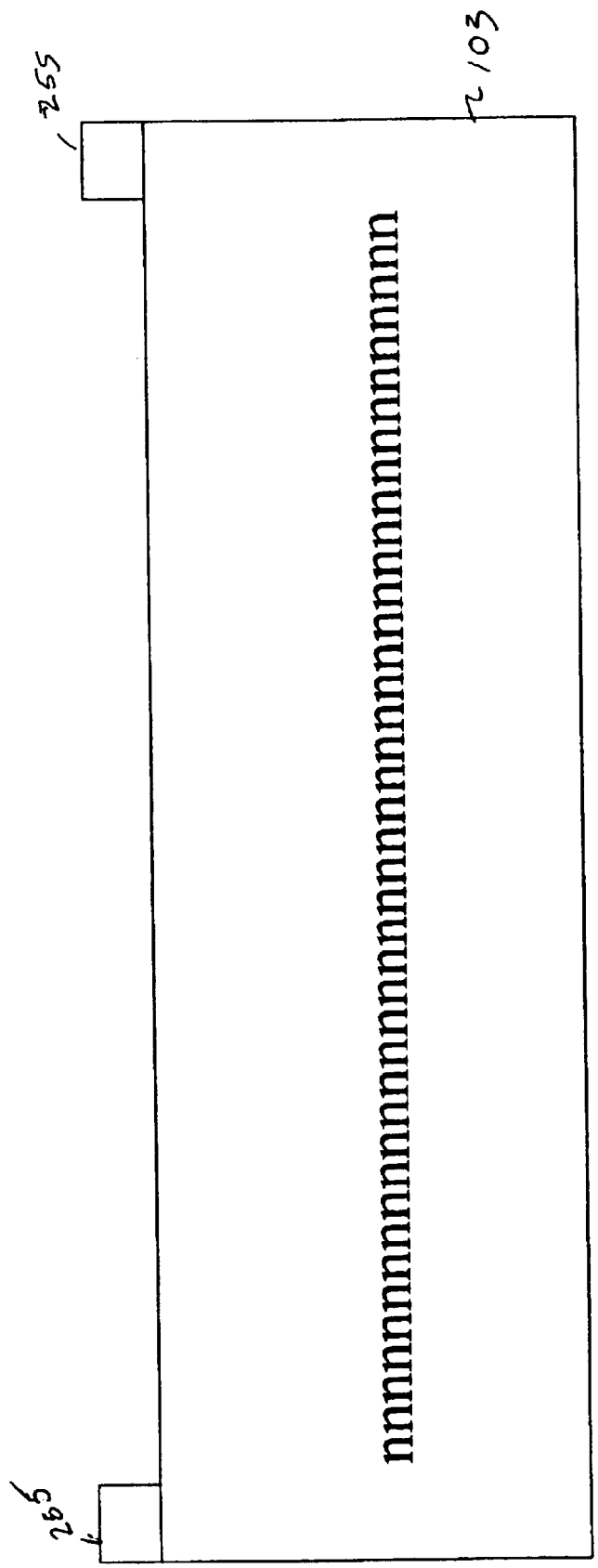

FIG. 8a illustrates the steps used to manufacture the invention and includes a P type substrate 103 on which there is an oxide mask grown 255. An N type doping is implanted and annealed as is indicated by the areas n. Proceeding to FIG. 8b, after annealing there is an area 303 that is an n conductive area and a p type area 241. The mask 255 is removed and a second mask 256 made of oxide is grown, and a second implant of p type material is performed, as shown in FIG. 8c. FIG. 8d shows a p type layer 241, and n type layer 242 and a p region 350. The mask 256 is removed and as shown in 8e, an oxide mask 257 is grown and an n implant is performed.

Figure 8H:
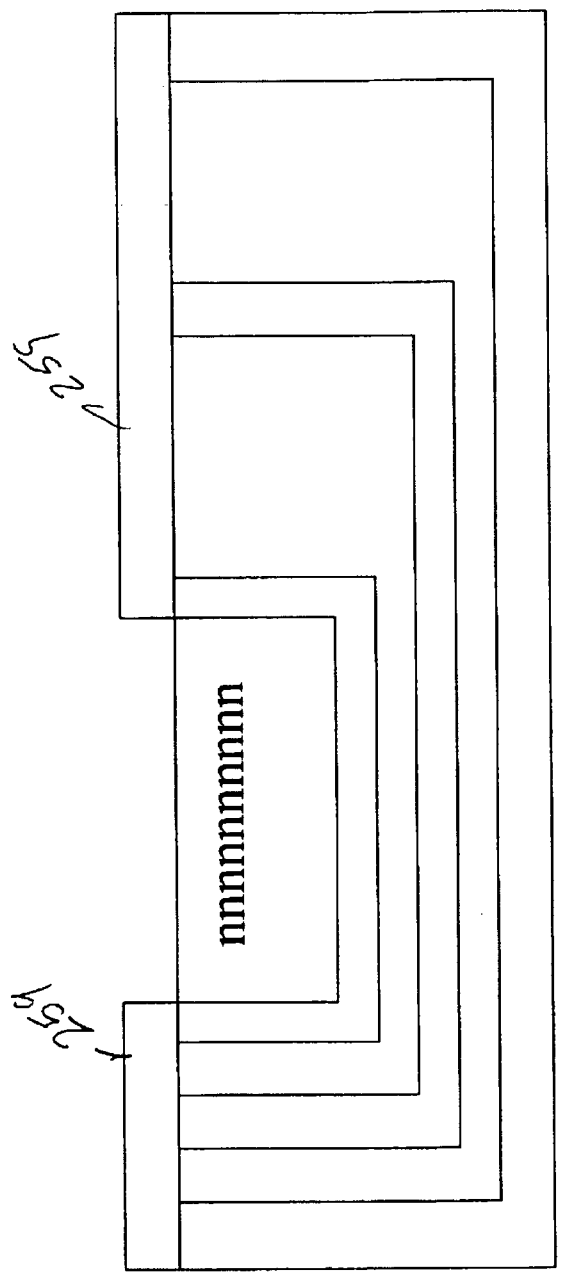
Figure 8I:
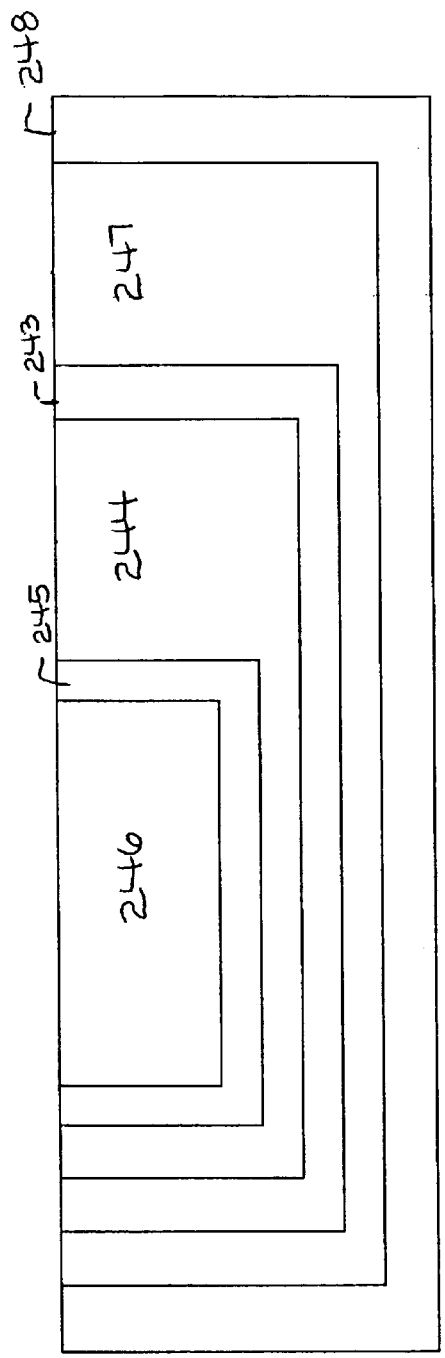

In FIG. 8f a mask 257 is removed and a new mask 258 is grown after annealing of the n type layer 244. In steps 8e, a p implant is performed and then an anneal process is created to achieve the layer 245. The mask 258 is then removed and a second mask 259 is grown so that an n type implant can be performed, shown in FIG. 8h. After the n type implant, we are left with the embodiment of FIG. 8i, showing the nested, alternating p and n type regions.

Figure 7:
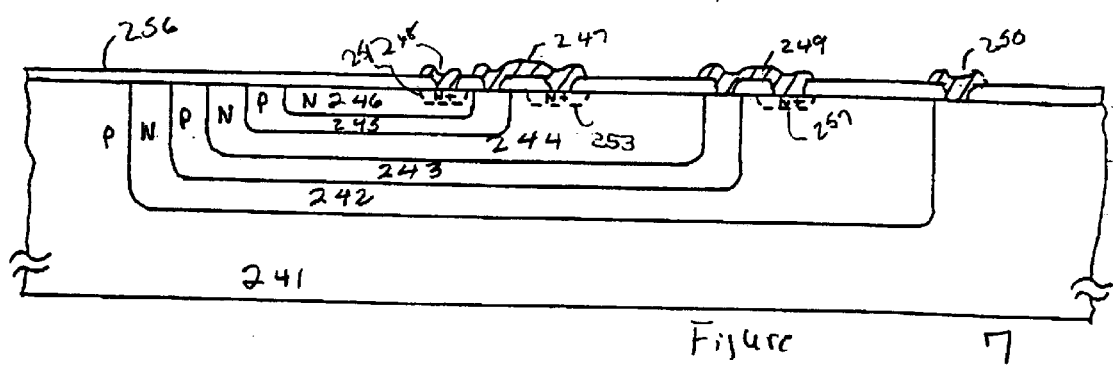
FIG. 7 is a cross sectional view of the embodiment of FIG. 6.
Figure 8J:
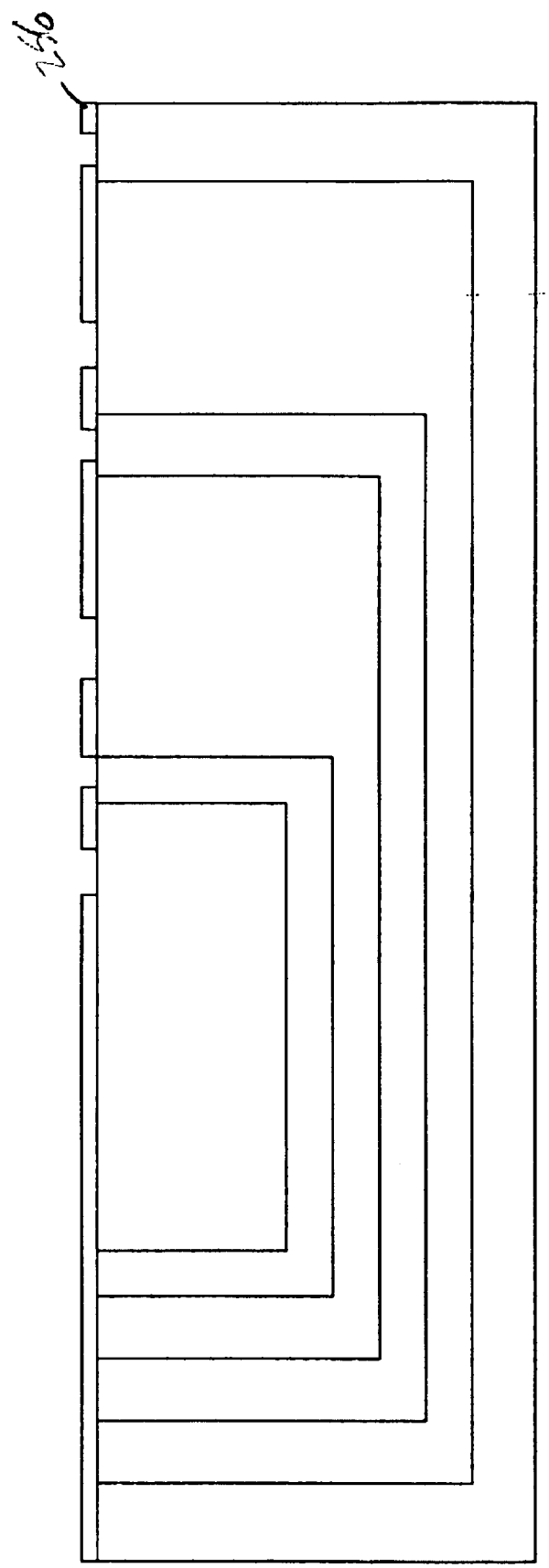

Referring to FIG. 8j, a mask step is performed and an oxide layer is grown which is layer 256, which after a metalization process can be used to achieve the device of FIG. 7. This sequence of steps uses a separate masking oxide layer for each implant step and junction. However, the narrow p-type regions may also be formed using the same oxide mask for the p-type region and the subsequent N-type region and optimizing the p-type drive-in cycles.

Figure 9:
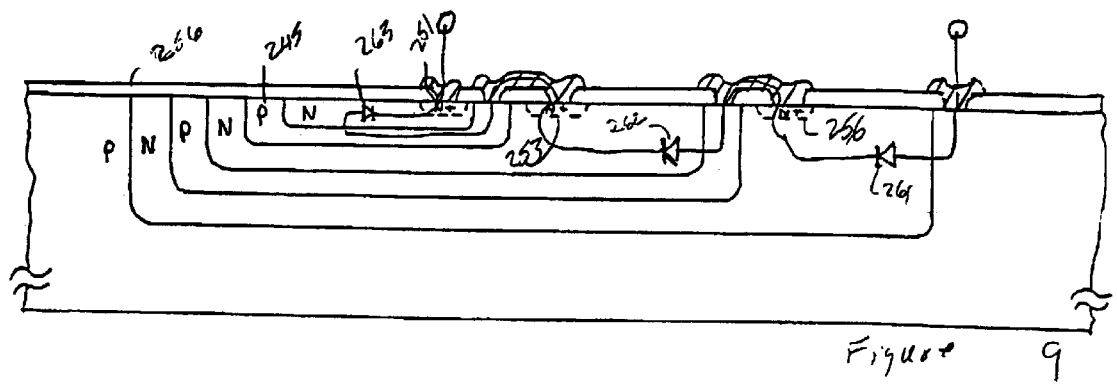
FIG. 9 is a schematic illustration of the embodiment of FIG. 6.

FIG. 9 provides a schematic representation of the series photodiodes and includes a first photodiode 261 that is made by a connection between the P region 241 with the N+ region 257. A second diode 262 is created by the connection between the P region 243 and the N+ region 253. Finally a third diode 263 is provided between the P region 245 and the N+ region 251.

Figure 10:
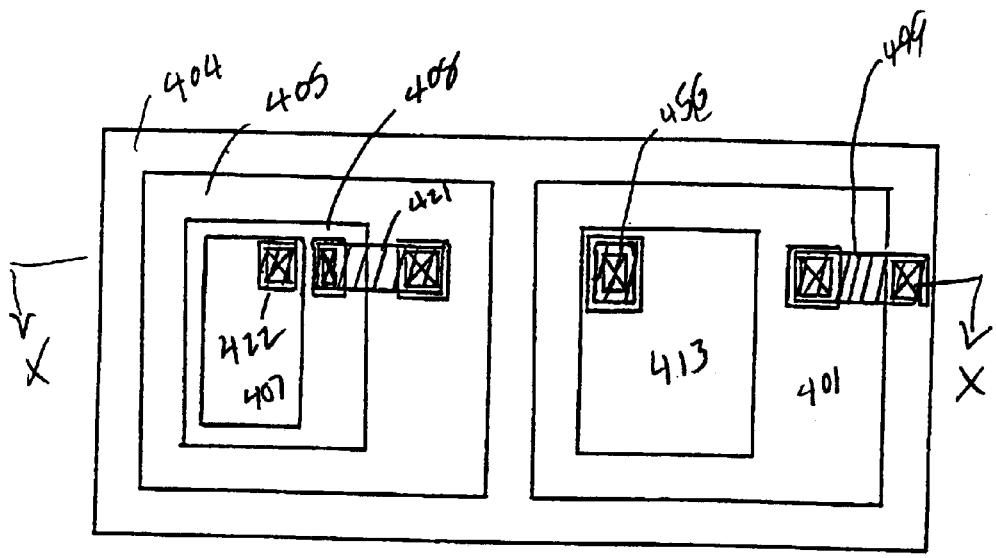
FIG. 10 shows an alternate embodiment of a photodiode stack from a top view.

FIG. 10 represents another alternate embodiment of the invention that uses an N− type epitaxial layer on a p-type substrate where there is an n region 405, in which a p region 407 is nested, in which a second n region 408 is nested.

Figure 11:
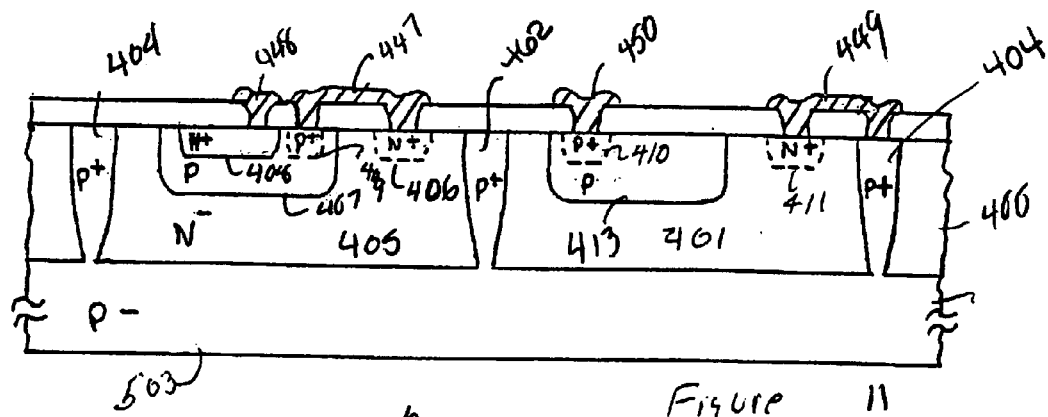
FIG. 11 is cross sectional view of the embodiment of FIG. 10.
Figure 12:
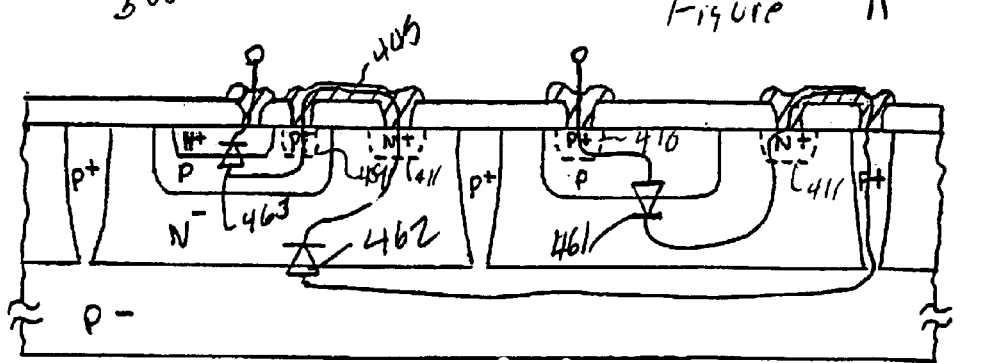
FIG. 12 is a schematic illustration of the embodiment of FIG. 10.

FIG. 11 which is a cross section of FIG. 10, shows the N− region 405 nested in a P− substrate 503 and includes a frame of P+ regions 404 that connect the surface of n− region 400 to the p-region 503. The frame 404 surrounds an N− well 405 in which an implanted p region 407 is made. Additionally, within the region 407 there is an implanted N+ region 408 which is connected to a terminal 448. A connector 447 connects a P+ region 409 to an N+ region 406. Similarly within the frame area 404, there is an n region 401 in which a p region 413 is implanted. There is a terminal 450 and a connector 449. Connector 449 connects an N+ region 411 to the P+ region 404, the terminal 450 is connected to a P+ region 410 which is connected to a p region 413. There is a diode between the P+ region 462, between the P+ region 404 and between the N+ region 411 which uses the conductor 447 to connect to the P+ region 409 which is connected to the N+ region 408. Similarly, N+ region 411 is connected by the diode configuration 461 to the P+ region 410 to form a series of three diodes as seen in FIG. 12.

Figure 13:
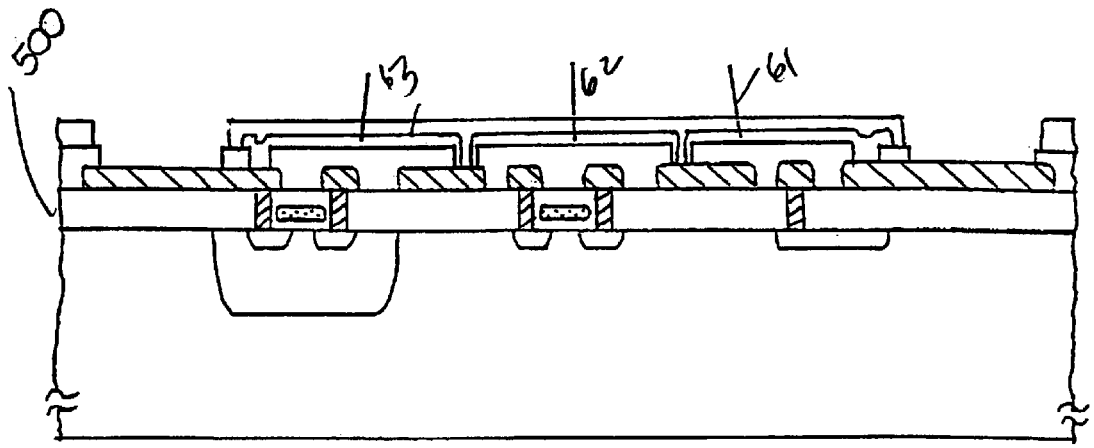
FIGS. 13 and 14 illustrates the photodiodes mounted on top of an integrated to chip.
Figure 14:
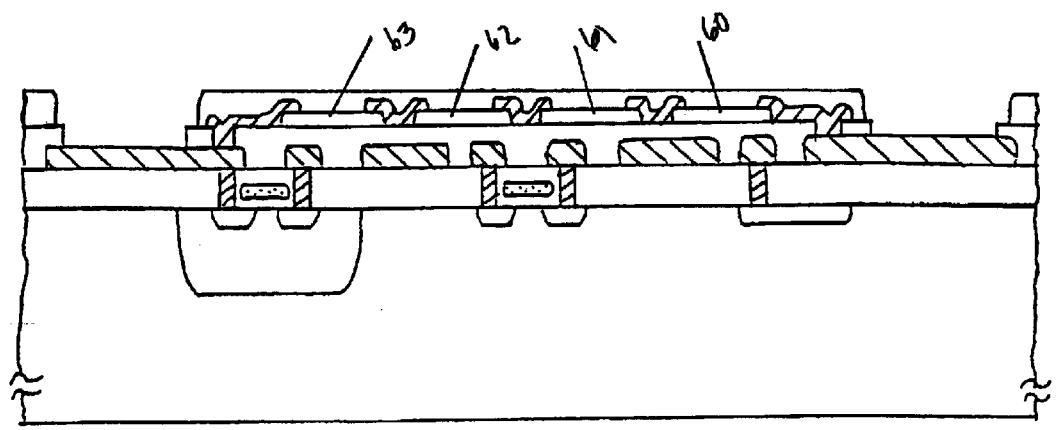

Referring to FIG. 13, the circuit as shown where the series three diodes 61, 62 and 63 are mounted on top of an integrated circuit 500. Using the conductors formed, the three (or more) diodes can be connected in series by conductors 60, 61, 62 and 63 of FIG. 14.

Figure 15:
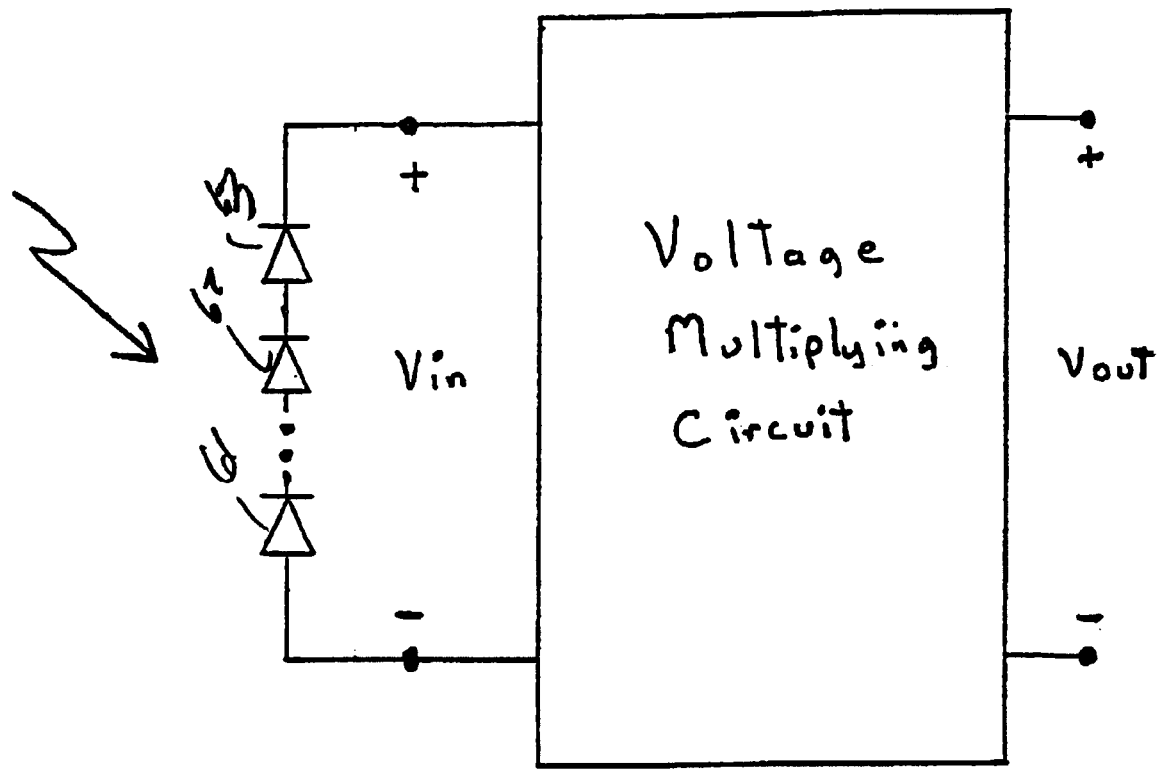
FIG. 15 is a block diagram showing the generation of a high voltage using a photodiode stack and a voltage multiplier.

Finally, FIG. 15 provides an illustration where the series diodes 61, 62 and 63 are connected to a voltage multiplying circuit, such as a charge pump, disclosed and incorporated by referenced patents, is used to convert the low voltage into an output voltage.

What is claimed is:

1. A series connection of photodiode comprising:
    a first layer of semiconductive material of a first conductivity type having spaced regions of a second type of conductivity connecting a first surface to a second surface of the first layer;
    a second layer of semiconductive material of a second conductivity type having spaced regions of a first type of conductivity connecting a first surface to a second surface of the second layer, the second layer be located and in alignment with the first layer such that each spaced region of the second layer is in electrical contact with a spaced region of the first layer; and
    a plurality of conductors arranged on the first surface of the second layer such that each spaced region of the first type of conductivity is in ohmic contact with an area of the second type of conductivity of the second layer.

2. The series connection of photodiodes according to claim 1 wherein each ohmic contact further comprises: a region of the second conductivity having a doping concentration grater than that of the second layer.

3. The series connection of photodiodes according to claim 2 wherein the first type of conductivity of the spaced regions of the second layer has a greater concentration than the first type of conductivity of the first layer.

4. The series connection of photodiodes according to claim 2 wherein the second type of conductivity of the spaced regions of the first layer has a greater concentration than the second type of conductivity of the second layer.

5. The series connection of photodiodes according to claim 2 wherein each spaced region of the second layer is in electrical contact with the first conductivity type first layer.

6. The series connection of photodiodes according to claim 2 wherein each spaced region of the first layer is in electrical contact with the second conductivity type second layer.

7. The series connection of photodiodes according to claim 2 wherein the first layer has a predefined width and length and the spaced regions are spaced across the width of the first layer.

8. The series connection of photodiodes according to claim 7 wherein the spaced regions are arranged across the predefined width to provide stripes of second conductivity regions.

9. The series connection of photodiodes according to claim 2 wherein the second layer has a predefined width and length and the spaced regions are spaced across the width of the second layer.

10. The series connection of photodiodes according to claim 9 wherein spaced regions are arranged across the predefined width to provide stripes of second conductivity regions.

11. A series connection of photodiodes comprising:
    a layer of semiconductor material of a first conductivity type having a first and second surfaces, the first surface being opposite the second surface, the layer further includes a layer of silicon dioxide on the first surface;
    a plurality of closed regions of a second conductivity type connecting the second surface of the layer of semiconductor material to the first surface, the closed regions being nested and separated from each other by regions of the first conductivity type; and
    a plurality of conductors arranged on the second surface of the layer of semiconductor material such that each closed region of the second type of conductivity is in ohmic contact with a region of the first conductivity type of the first type of conductivity of the layer of semiconductor material.

12. The series connection of photodiodes according to claim 1 wherein each ohmic contact further comprises: a region of the second conductivity having a doping concentration grater than that of the layer of semiconductor material.

13. A series connection of photodiodes comprising:
a layer of semiconductor material of a first conductivity type having a first and second surfaces, the first surface being opposite the second surface;
a plurality of closed embedded regions of a second conductivity type connected to the second surface, the closed regions being nested and separated from each other by regions of the first conductivity type; and
a plurality of conductors arranged on the second surface of the layer of semiconductor material such that each closed region of the second type of conductivity is in ohmic contact with a region of the first conductivity type of the first type of conductivity of the layer of semiconductor material.

14. The series connection of photodiodes according to claim 13 wherein each ohmic contact further comprises: a region of the second conductivity having a doping concentration grater than that of the layer of semiconductor material.

* * * * *